United States Patent [19]
Goetting et al.

[11] Patent Number: 5,912,937
[45] Date of Patent: Jun. 15, 1999

[54] CMOS FLIP-FLOP HAVING NON-VOLATILE STORAGE

[75] Inventors: F. Erich Goetting; Scott O. Frake, both of Cupertino, Calif.

[73] Assignee: Xilinx, Inc., San Jose, Calif.

[21] Appl. No.: 08/816,100

[22] Filed: Mar. 14, 1997

[51] Int. Cl.[6] .................................................. G11C 19/00
[52] U.S. Cl. .............................. 377/67; 377/81; 327/200; 327/218; 257/315
[58] Field of Search ........................... 377/67, 81; 326/39, 326/40, 41, 45; 327/200, 218; 257/315

[56] References Cited

U.S. PATENT DOCUMENTS

| | | | |
|---|---|---|---|
| 4,754,432 | 6/1988 | Topich | 377/67 |
| 5,487,037 | 1/1996 | Lee | 365/225.7 |
| 5,760,603 | 6/1998 | Zhou | 326/40 |

*Primary Examiner*—Margaret Rose Wambach
*Attorney, Agent, or Firm*—Crosby, Heafey, Roach & May; Jeanette S. Harms

[57] ABSTRACT

A flip-flop includes non-volatile storage of a bit for encryption purposes or other applications. The non-volatile bit remains in the flip-flop, substantially unaltered, irrespective of normal flip-flop operation, and is available to be recalled whenever it is needed. The flip-flop is implemented using a pair of CMOS cells. Each cell includes a floating gate formed by connecting the gates of an n-mos transistor and a p-mos transistor. One of the two floating gates is selectively charged by hot electron injection, thereby raising the threshold of that cell. Depending upon which of the two cells is programmed by this process, the flip-flop outputs a logic one or a logic zero during a recall mode.

10 Claims, 5 Drawing Sheets

5,912,937

CMOS FLIP-FLOP HAVING NON-VOLATILE STORAGE

BACKGROUND OF THE INVENTION

1. Field of the Invention

The present invention relates to a programmable logic device, and more specifically to a flip-flop having non-volatile storage.

2. Description of the Related Art

A flip-flop is a 1-bit temporary storage element which samples its input signals (provided on the terminal labeled "d") and changes its output signals (provided on the terminal labeled "q") only at times determined by an edge of a clocking signal. Thus, the output signal is in steady state at least until another predetermined edge of the clocking signal. In that sense, the flip-flop is a storage element because it "remembers" its current state until the input signal changes and the predetermined edge occurs. However, a conventional storage element can be written into at least once, read as desired, and once written doesn't change unless rewritten.

In some applications, it may be desirable for a flip-flop to provide its temporary storage function as described above, as well as a conventional storage element capability, i.e. wherein the output signal selectively takes on the state of a previously written (stored) bit irrespective of the input signal. For example, for purposes of encryption, a plurality of such flip-flops interconnected to form a register may be loaded with a secret bit pattern which must be replicated by a user of a device before the device functions properly.

It would therefore be desirable to provide a flip-flop having the additional capability for non-volatile storage which may be read at will to recall a previously written bit of information. It would also be desirable if this added capability were accomplished without requiring a substantial increase in the number of electrical components in, or associated with, the flip-flop.

SUMMARY OF THE INVENTION

In accordance with the present invention, a flip-flop circuit provides non-volatile storage of a bit. The non-volatile bit remains in the flip-flop, substantially unaltered, irrespective of normal flip-flop operation, and is recalled whenever it is needed for encryption purposes or other applications.

The flip-flop circuit of the present invention is implemented with a pair of CMOS cells, each cell including a floating gate. In one embodiment, the gates of an n-mos transistor and a p-mos transistor are connected to form the floating gate. One of the two floating gates is selectively charged by hot electron injection, thereby raising the threshold of that cell. Depending upon which of the two cells is programmed, the flip-flop circuit outputs a logic 1 or a logic 0 signal during a recall mode.

Therefore, an object of the present invention is to provide a CMOS flip-flop having the feature of non-volatile storage, wherein the non-volatile storage is a product of a single-polysilicon MOS process.

An additional object of the invention is to provide a flip-flop having a pair of CMOS cells to provide the non-volatile storage, such cells being configured to permit normal flip-flop operation as well as recall of the non-volatile bit.

Yet another object of the invention is to provide a novel CMOS cell having a floating gate which may be charged by hot electron injection to increase the threshold, thereby programming such cell.

Yet another object of the invention is to provide a shift register comprising a plurality of stages, at least one stage having the capability to be programmed to a selected state and to recall that programmed state at a subsequent time.

DETAILED DESCRIPTION OF THE DRAWINGS

Figure 1:
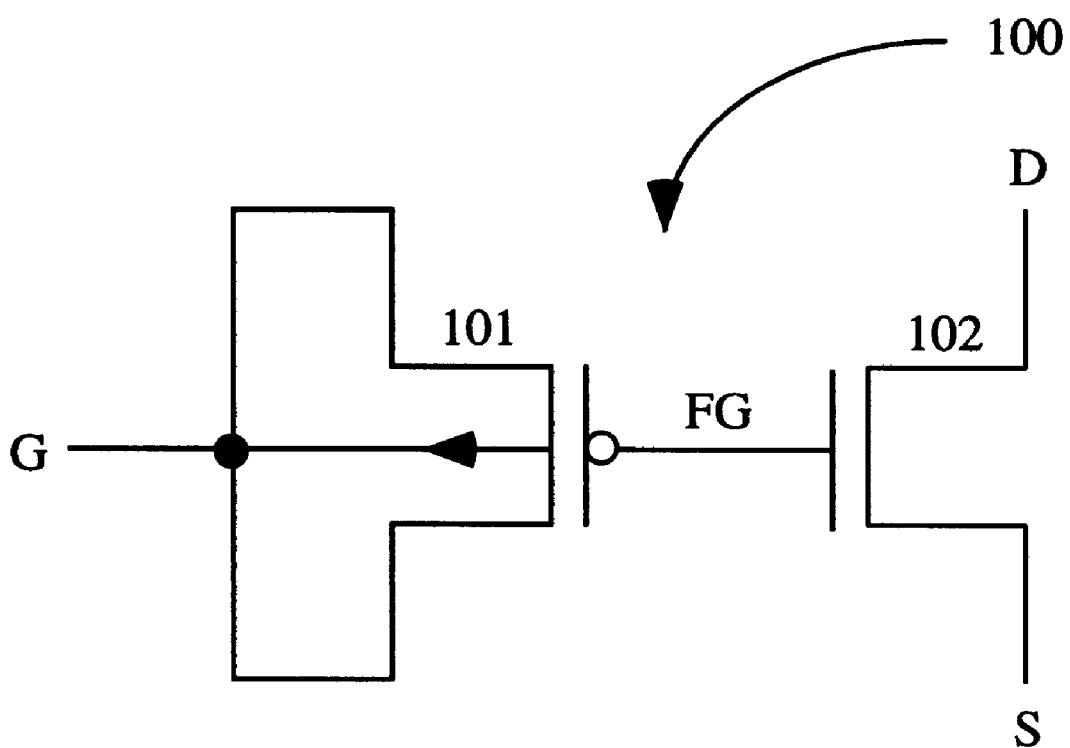
FIG. 1 illustrates a CMOS cell in accordance with the present invention.

FIG. 1 illustrates a CMOS cell 100 in accordance with the present invention. Cell 100 includes a p-mos transistor 101 and an n-mos transistor 102 with their respective gates being interconnected, thereby forming a floating gate FG. The source, drain and substrate of p-mos transistor 101 are coupled to a common line, i.e. the gate G of cell 100. The drain D and source S of cell 100 are provided by the respective source and drain of n-mos transistor 102.

In accordance with the present invention, floating gate FG (FIG. 1) is a polysilicon (hereinafter "poly") gate layer separated from a doped silicon substrate by a gate oxide layer. This oxide layer effectively isolates the poly gate electrically from the two transistor doped portions. One side of the poly gate is associated with an n-doped portion of the substrate forming n-mos transistor 102, whereas the other side of the poly gate is associated with a p-doped portion of the substrate forming p-mos transistor 101.

Figure 2:
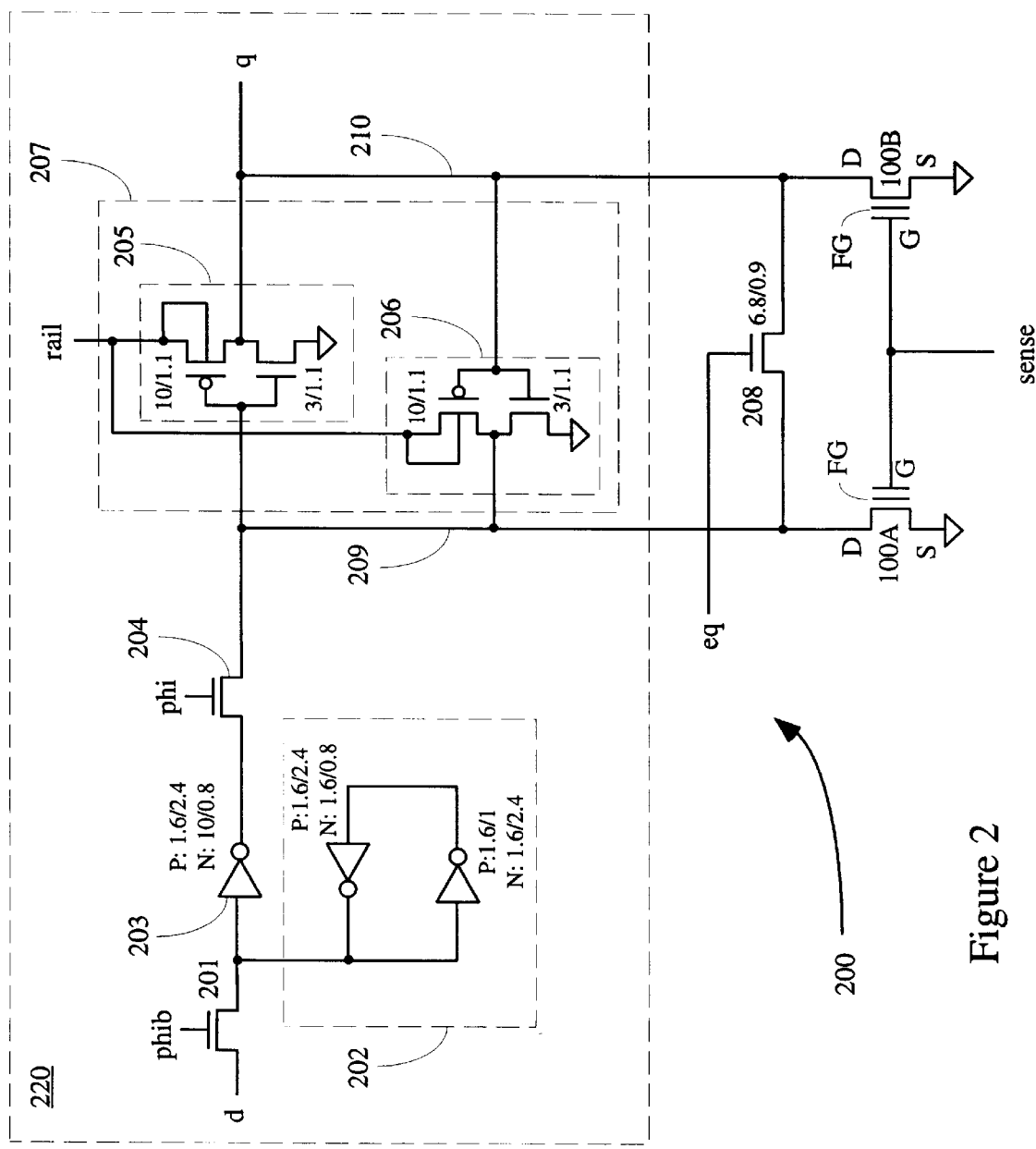
FIG. 2 shows one embodiment of a flip-flop circuit in accordance with the present invention.

FIG. 2 shows a flip-flop circuit 200 incorporating two cells of the present invention. Specifically, flip-flop circuit 200 includes a known flip-flop 220 with cells 100A and 100B, each having the configuration of cell 100 (FIG. 1). A signal on an input terminal d of flip-flop circuit 200 is stored in a latch 202 if a logic 1 signal is provided to terminal phib. This input signal is inverted by inverter 203 and then stored in latch 207 only if a logic 1 signal is provided to terminal phi. The bit stored in latch 207 is provided as the signal on an output terminal q of flip-flop circuit 200. Note that terminals phi and phib form a conventional clock terminal for flip-flop circuit 200. Exemplary sizes of the transistors for cross-coupled inverters 205 and 206 of latch 207 and for the transistors (not shown for simplicity) in the inverters of latch 202 are shown in FIG. 2. Other embodiments of the present invention provide other sizes.

In accordance with the present invention, two cells 100A and 100B are coupled to flip-flop 220 via lines 209 and 210. Specifically, the drains D of cells 100A and 100B are connected to lines 209 and 210, respectively, whereas the sources S of those cells are connected to a low voltage source (ground). The gates G of cells 100A/100B are commonly connected to a terminal sense.

The floating gates FG of cells 100A/100B are selectively charged by a process called hot electron injection which raises the threshold of one cell or the other. Depending upon which of the two cells is charged by this process, flip-flop circuit 200 is then programmed to output a logic 1 or a logic 0 on output terminal q during a recall mode.

Programming of one of cells 100A/100B is accomplished by applying a programming voltage to its gate G and a high voltage to its drain D. In the embodiment of the invention shown in FIG. 2, a programming voltage pulse is provided to terminal sense and thus to the gates G of cells 100A and 100B. During programming, a high voltage pulse is provided to terminal rail and thus to latch 207. Therefore, one of lines 209/210 provides this high voltage, whereas the other line provides a low voltage. The voltage on terminal eq is kept low during programming, thereby ensuring that transistor 208 is non-conducting and that lines 209 and 210 provide their respective voltages to the drains D of cells 100A and 100B.

For example, assuming that line 209 provides the high voltage, then a large current flows through the n-mos transistor (not shown) of cell 100A to source S. In a process called hot electron injection, the programming voltage on gate G pulls the electrons through the oxide toward the floating gate of cell 100A, thereby causing charge to be collected on that floating gate. The charge on that floating gate FG increases the threshold voltage of cell 100A such that if subsequently selected, via a high voltage on gate G, cell 100A will not turn on. Because cell 100A exhibits a high threshold voltage, cell 100A is deemed programmed. It logically follows that because cell 100B receives a low voltage on its drain, cell 100B has substantially no charge on its floating gate and thus maintains a low threshold. Therefore, if subsequently selected via gate G, cell 100B turns on. Because cell 100B exhibits a low threshold voltage, cell 100B is deemed unprogrammed.

In summary, the state of latch 207 determines the programming of cells 100A/100B. Moreover, because floating gates FG are electrically isolated in cells 100A/100B (see cell 100 of FIG. 1), the charge transferred to the floating gate of the programmed cell remains substantially constant over a long period of time.

During a recall operation, a logic 1 signal is provided on terminal eq, thereby turning on transistor 208 and ensuring that the voltages on lines 209 and 210 are substantially at the trip point of cells 100A/100B. In this manner, after the short is removed (by providing a logic 0 signal on terminal eq), flip-flop circuit 200 responds to the difference in thresholds and effectively "tilts" toward and "falls" into one state. That state is a function of which cell has been charged by hot electron injection. Specifically, the programmed cell reduces any current flow during recall, whereas the unprogrammed cell allows current flow. Therefore, flip-flop 200 tilts towards providing a low voltage on the drain of the unprogrammed cell. In this manner, the non-volatile bit stored by cells 100A/100B may be recalled at any time and dictates the output of flip-flop circuit 200 until that output is changed by conventional flip-flop operation (described in detail in reference to FIG. 3A).

Figure 3A:
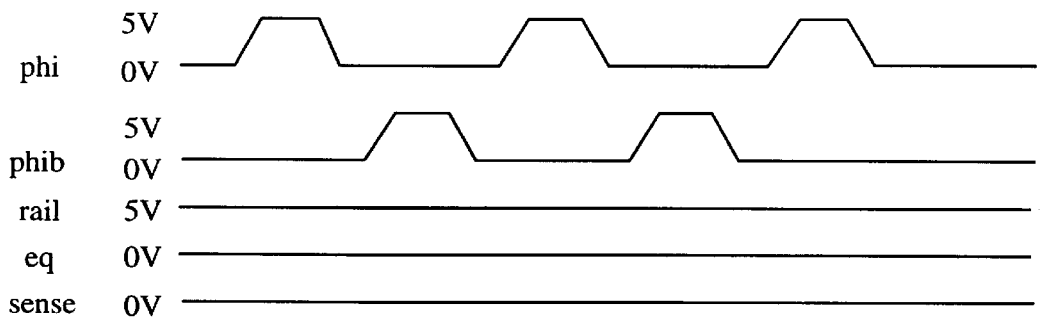
FIGS. 3A, 3B and 3C illustrate various signals generated during normal flip-flop operation, programming of the flip-flop, and recall of the non-volatile bit, respectively.

FIG. 3A illustrates the state of various signals in flip-flop circuit 200 in a conventional flip-flop mode. In a conventional mode, the signals on terminals phi and phib are applied to transistors 201 and 204 to transfer the input signal on terminal d to latches 202 and 207. A signal of 5 volts on terminal rail is applied steady state to both inverters 205 and 206. Both signals on terminals eq and sense are zero, thereby ensuring that cells 100A/100B do not effect latch 207. In this manner, the output signal on terminal q of flip-flop circuit 200 assumes the state of the input signal at terminal d. Thus, irrespective of the non-volatile bit stored by cells 100A/100B, normal latch-type operation of flip-flop circuit 200 may take place.

Figure 3B:
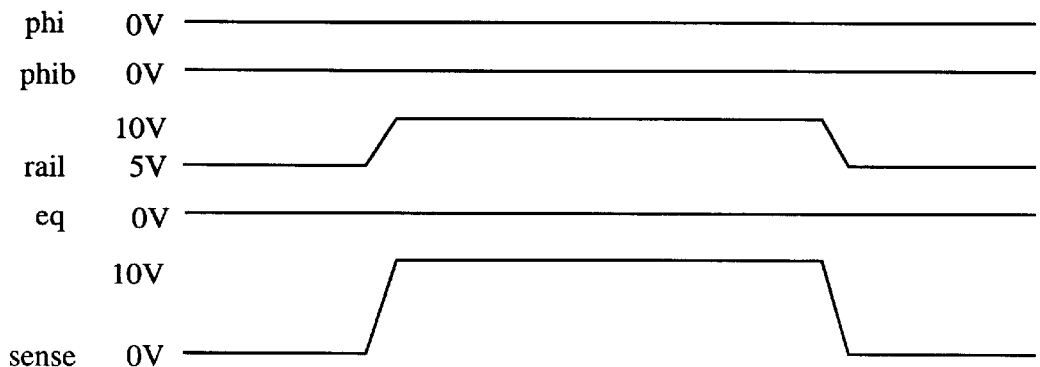

FIG. 3B illustrates the state of various signals in flip-flop circuit 200 in a program mode. In a program mode, the signals on terminals phi and phi b are zero, thereby isolating latch 207 and cells 100A/100B from input terminal d while flip-flop circuit 20 remains in the last state of data shifting. A high voltage (in one embodiment 10 volts) is then provided on terminal rail to inverters 205/206. A programming voltage (in this embodiment 10 volts) on terminal sense causes current to flow through one of cells 100A and 100B depending upon the signal on terminal q. Specifically, as described previously, a logic 0 signal on output terminal q causes current to flow through cell 100A, whereas a logic 1 signal on output terminal q causes current to flow through cell 100B. The floating gate of the cell with high current flow will, through capacitive coupling, be charged, thereby increasing the threshold of that cell.

Figure 3C:
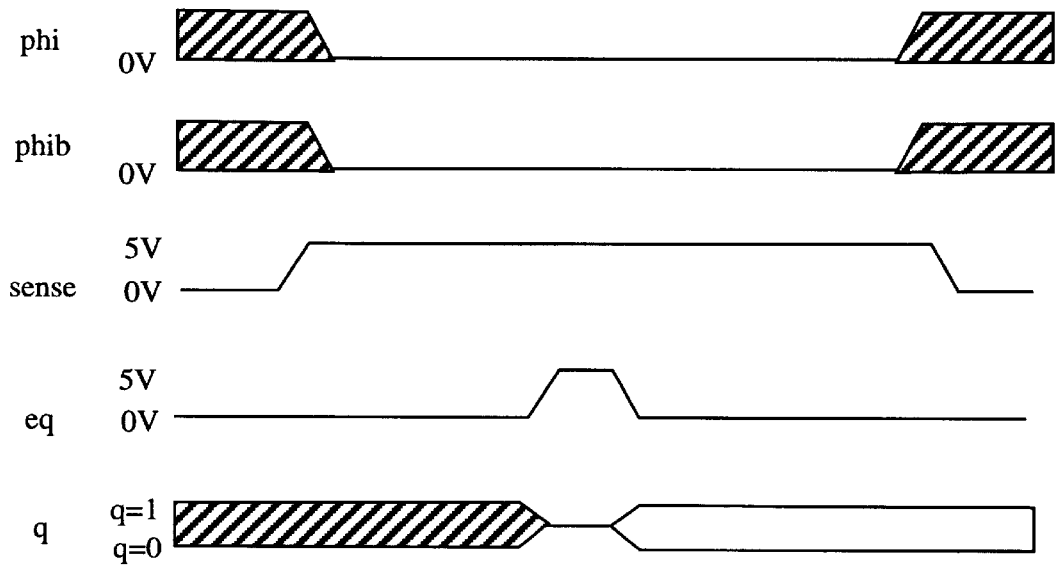

FIG. 3C illustrates the state of various signals in flip-flop circuit 200 in a recall mode. In a recall mode, the signals on terminals phi and phib are zero, whereas the signal on terminal rail (not shown) is maintained at 5 volts. The signal on terminal sense is brought to 5 volts and a pulsed signal is applied to terminal eq to temporarily turn on transistor 208. In this manner, both lines 209 and 210 (temporarily shorted) are substantially at the same voltage, i.e. at the trip point of cells 100A and 100B. After the pulse on terminal eq, the state of latch 207 is free to change, but does so based upon the difference in thresholds of cells 100A/100B (one of which has been increased in the program mode). Thus, the signal on terminal q takes on the same state as during the program mode. In this manner, the state of the non-volatile bit stored by cells 100A/100B is recalled and read out of flip-flop circuit 200.

Figure 4A:
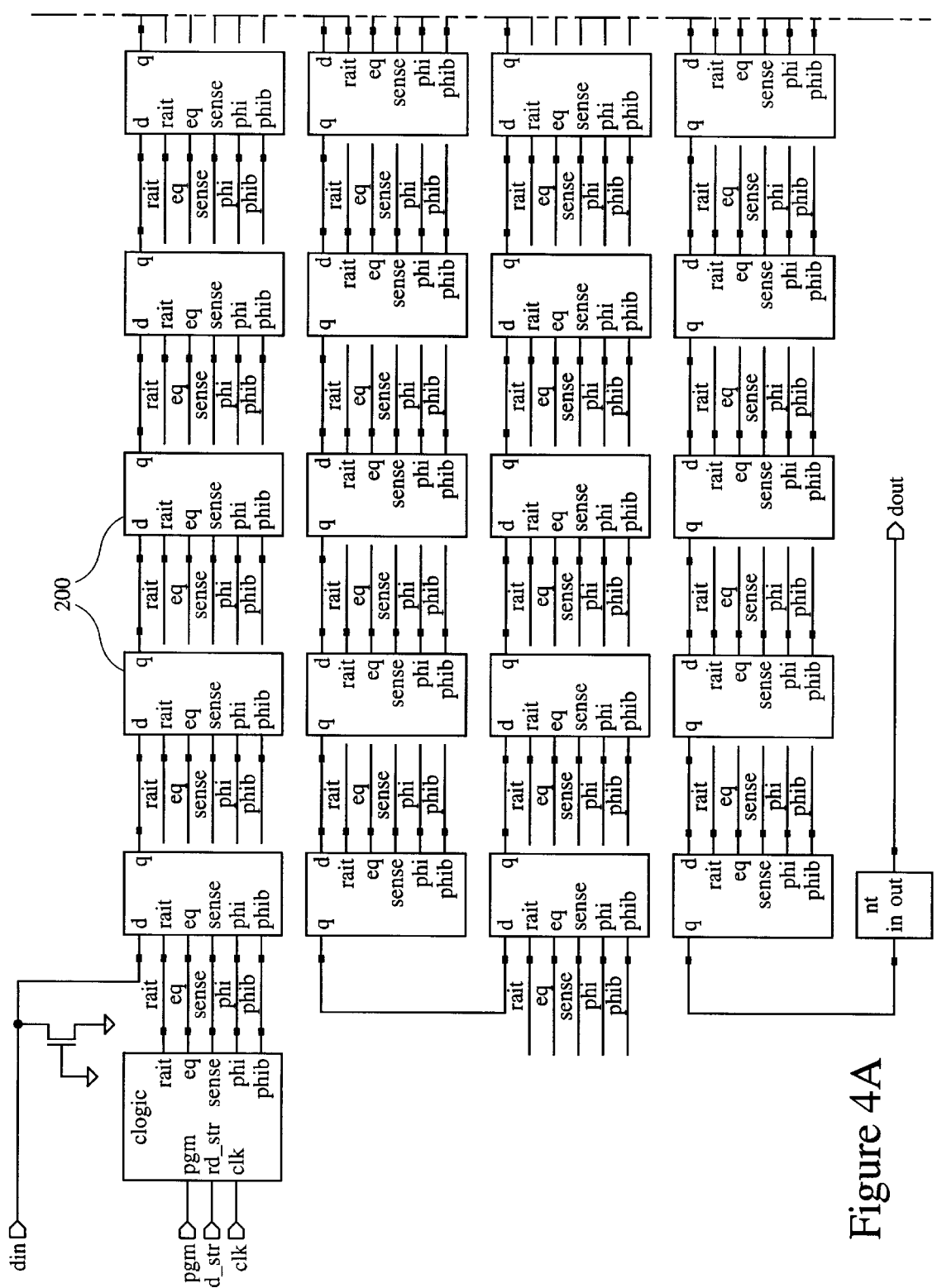
FIG. 4 illustrates an exemplary 32-bit shift register using the flip-flop circuits of the present invention.
Figures 4, 4B:
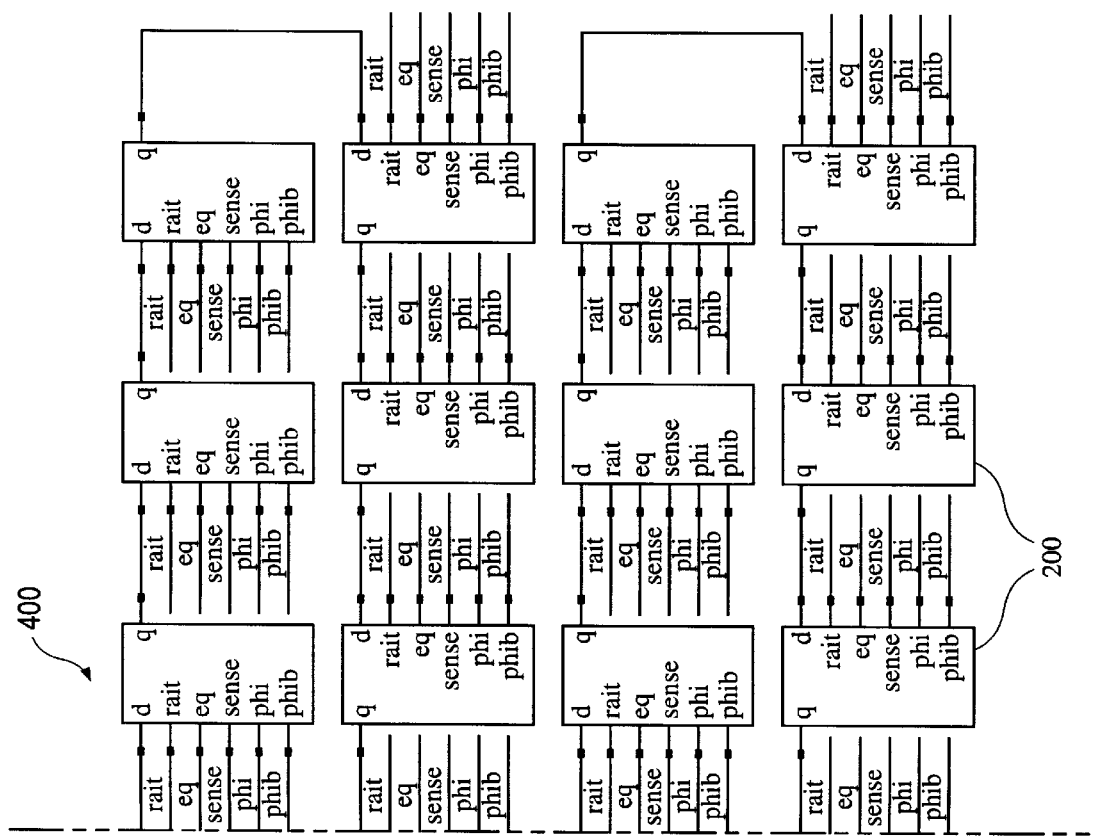

FIG. 4 illustrates a 32-bit shift register 400 formed from 32 flip-flop circuits 200. In a normal data shifting mode, 32 bits of data are shifted into and out of shift register 400, one bit per shift in a conventional manner. At any point, the state of all 32 bits can be programmed into the respective 32 flip-flop circuits as discussed above. In accordance with the present invention, at any subsequent time, even after additional shifting of new data into and out of shift register 400, the 32 bits of non-volatile data can be recalled. Register 400 may be used for purposes of encryption, wherein flip-flops 200 are loaded with a secret bit pattern which must be replicated by a user of a device before a device functions properly.

Those having skill in the relevant arts will now, as a result of the disclosure made herein, perceive various additions and modifications which may be made to the invention. For example, the precise voltages referred to herein, as well as the illustrated solid state devices and their respective CMOS processors, may be readily altered while still achieving the underlying features and advantages of the invention. Moreover, although the present invention is typically used in a One Time Programmable application, other applications provide for erasing of the memory cells with ultraviolet light by including the appropriate passivation layer on the device and window in the chip package. Further, it will be understood that larger or smaller shift registers can be readily configured with the present invention to provide both conventional data shifting as well as non-volatile data storage. Accordingly, such additions and modifications are deemed to be within the scope of the invention which is limited only by the appended claims.

We claim:

1. A flip-flop circuit providing non-volatile storage comprising:
   a flip-flop for storing a logic state; and
   a pair of cells coupled to said flip-flop for providing non-volatile storage of said logic state wherein each of said cells is a product of a single-polysilicon metal oxide semiconductor (MOS) process.

2. The flip-flop circuit of claim 1 wherein each cell comprises a device having a floating gate.

3. The flip-flop circuit of claim 1 wherein said flip-flop includes:

a first latch;

a second latch; and means for isolating said first latch from said second latch.

4. The circuit of claim 1 further comprising a plurality of flip-flops connected to form a shift register.

5. The flip-flop circuit of claim 2 wherein each of said cells comprises:

an n-mos transistor having a gate, a source, and a drain; and a p-mos transistor having a gate, a source, and a drain, wherein said gates of said n-mos and p-mos transistors are connected to form said floating gate.

6. The flip-flop circuit of claim 5 wherein said source, said drain, and the substrate of said p-mos transistor are connected to form a control gate for said cell.

7. The flip-flop circuit of claim 6 wherein said source and said drain of said n-mos transistor form a source and a drain for said cell.

8. A flip-flop circuit comprising:

means for shifting a binary signal into said circuit;

means for temporarily storing said binary signal; and means for programming said circuit with said binary signal, wherein said programming means is a product of a single-polysilicon metal oxide semiconductor (MOS) process, and said means for shifting, said means for temporarily storing, and said means for programming are operatively coupled.

9. The flip-flop circuit of claim 8 wherein said means for programming includes a pair of interconnected cells, each cell having an adjustable threshold.

10. The flip-flop circuit of claim 9 wherein said cell includes a floating gate, and said means for programming includes means for charging said floating gate.

* * * * *